US008456069B2

(12) United States Patent
Lee et al.

(10) Patent No.: US 8,456,069 B2
(45) Date of Patent: Jun. 4, 2013

(54) ORGANIC ELECTROLUMINESCENT DISPLAY DEVICE AND METHOD OF MANUFACTURING THE SAME

(75) Inventors: Hyun Lee, Gyeongsangbuk-do (KR);
Kwon-Min Park, Busan (KR);
Sang-Woo Seo, Daegu (KR); Hye-Min Park, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 804 days.

(21) Appl. No.: 12/630,351

(22) Filed: Dec. 3, 2009

(65) Prior Publication Data

US 2010/0156856 A1 Jun. 24, 2010

(30) Foreign Application Priority Data

Dec. 22, 2008 (KR) .................. 10-2008-0131130

(51) Int. Cl.
*H01J 1/02* (2006.01)
(52) U.S. Cl.
USPC ............................................ 313/46; 362/373
(58) Field of Classification Search
USPC ................................................ 313/45, 46, 512
See application file for complete search history.

(56) References Cited

U.S. PATENT DOCUMENTS

| 2002/0068191 | A1* | 6/2002 | Kobayashi | 428/690 |
| 2004/0065432 | A1* | 4/2004 | Smith et al. | 165/80.2 |
| 2005/0285518 | A1* | 12/2005 | Cok | 313/512 |
| 2007/0152222 | A1 | 7/2007 | Joo | |
| 2008/0012484 | A1 | 1/2008 | Park et al. | |
| 2008/0169750 | A1* | 7/2008 | Kim et al. | 313/498 |
| 2008/0291613 | A1* | 11/2008 | Sakata et al. | 361/681 |
| 2009/0135095 | A1 | 5/2009 | Kawada | |

FOREIGN PATENT DOCUMENTS

| CN | 1992264 | 7/2007 |
| CN | 101097940 | 1/2008 |
| CN | 101208732 | 6/2008 |
| CN | 101311997 | 11/2008 |

OTHER PUBLICATIONS

Chinese Office Action dated Jul. 26, 2011.

* cited by examiner

*Primary Examiner* — Anh Mai
*Assistant Examiner* — Andrew Coughlin
(74) *Attorney, Agent, or Firm* — Morgan, Lewis & Bockius LLP

(57) ABSTRACT

An organic electroluminescent display device includes forming an organic electroluminescent panel that includes a viewing surface for displaying images and an opposing surface and includes a plurality of source pads in a peripheral region of the organic electroluminescent panel; configuring at least one source IC to be on the opposing surface of the organic electroluminescent panel, wherein the at least one source IC outputs a source signal corresponding to the source pad; configuring a thermally conductive unit to contact the at least one source IC at an inner surface of the thermally conductive unit; and configuring a bottom case to contact an outer surface of the thermally conductive unit.

17 Claims, 5 Drawing Sheets

빛

ORGANIC ELECTROLUMINESCENT DISPLAY DEVICE AND METHOD OF MANUFACTURING THE SAME

The present invention claims the benefit of Korean Patent Application No. 2008-0131130, filed in Korea on Dec. 22, 2008, which is hereby incorporated by reference for all purposes as if fully set forth herein.

BACKGROUND OF THE INVENTION

1. Field of the Invention

The present invention relates to an organic electroluminescent display device, and more particularly, to an organic electroluminescent display (OELD) device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, organic electroluminescent display (OELD) devices are self-luminescent display devices. The OELD devices operate at low voltages and have a thin profile. Further, the OELD devices have fast response time, high brightness, and wide viewing angles.

The OELD device includes an organic electroluminescent panel as a display panel, a source PCB (printed circuit board) and a gate PCB. The source and gate PCBs are coupled with peripheral portions of the organic electroluminescent panel through TCP (tape carrier package) films and supply a source signal and a gate signal, respectively to the organic electroluminescent panel. The TCP film coupled with the source PCB includes a source IC (integrated chip), and the TCP film coupled with the gate PCB includes a gate IC.

After the organic electroluminescent panel is coupled with the source and gate PCBs, this organic electroluminescent panel, a top case and a bottom case are assembled. In the assembling process, the TCP films are bent so that the source and gate ICs are located on a bottom surface of the organic electroluminescent panel.

The source IC produces heat of high temperature, about 80 degrees Celsius (° C.) while the OELD device is operated. Such the heat causes the source IC to be deteriorated and reduced in lifetime. To solve this problem, a thermally conductive pad attached on the source IC is proposed. However, even though the thermally conductive pad absorbs heat from the source IC, transferring the absorbed heat outside the source IC is limited, and the absorbed heat is thus accumulated in the thermally conductive pad. Accordingly, efficiency of the thermally conductive pad is reduced, and much heat still remains in the source IC.

Alternatively, a fan or heat pipe installed in the bottom case is proposed. This thermally conductive means has thermally conductive effect to some extent. However, the effect is insignificant considered along with price. Further, thermally conductive structure and installation are complex. Further, installation of the thermally conductive means goes against a trend toward a slim outline in the OELD device field.

SUMMARY OF THE INVENTION

Accordingly, the present invention is directed to an organic electroluminescent display device and a method of manufacturing the same that substantially obviates one or more of the problems due to limitations and disadvantages of the related art.

An advantage of the present invention is to provide an organic electroluminescent display device and a method of manufacturing the same that can improve discharge of heat.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes an organic electroluminescent panel that includes a viewing surface for displaying images and an opposing surface and includes a plurality of source pads in a peripheral region of the organic electroluminescent panel; a bottom case configured to face the opposing surface of the organic electroluminescent panel; at least one source IC configured to output a source signal corresponding the source pad, and be between the bottom case and the opposing surface of the organic electroluminescent panel; and a thermally conductive unit configured to be between the at least one source IC and the bottom case and contact the at least one source IC and the bottom case.

In another aspect, a method of manufacturing an organic electroluminescent display device includes forming an organic electroluminescent panel that includes a viewing surface for displaying images and an opposing surface and includes a plurality of source pads in a peripheral region of the organic electroluminescent panel; configuring at least one source IC to be on the opposing surface of the organic electroluminescent panel, wherein the at least one source IC outputs a source signal corresponding to the source pad; configuring a thermally conductive unit to contact the at least one source IC at an inner surface of the thermally conductive unit; and configuring a bottom case to contact an outer surface of the thermally conductive unit.

In another aspect, an organic electroluminescent display device includes an organic electroluminescent panel that includes a viewing surface for displaying images and an opposing surface; a bottom case configured to face the opposing surface of the organic electroluminescent panel; a driving IC configured to be between the bottom case and the opposing surface of the organic electroluminescent panel; and a thermally conductive unit configured to be between the driving IC and the bottom case and contact the driving IC and the bottom case, wherein the thermally conductive unit includes: a cover plate made of a metallic material; a first elastic thermally conductive pad configured to contact the driving IC and an inner surface of the cover plate; and a second elastic thermally conductive pad configured to contact the bottom case and an outer surface of the cover plate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 1:
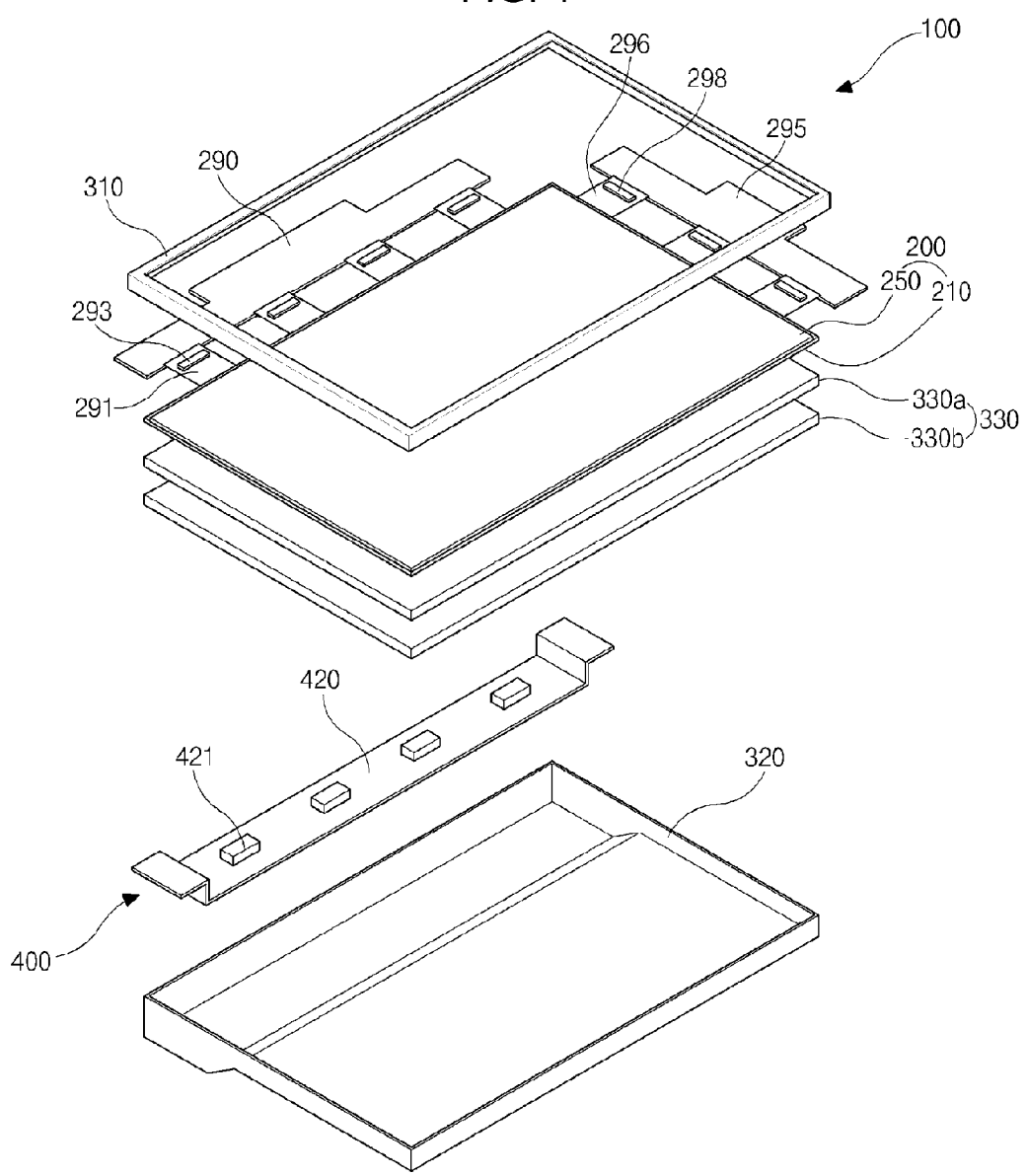
FIG. 1 is a schematic perspective view illustrating an OELD device according to a first embodiment of the present invention.
Figure 2:
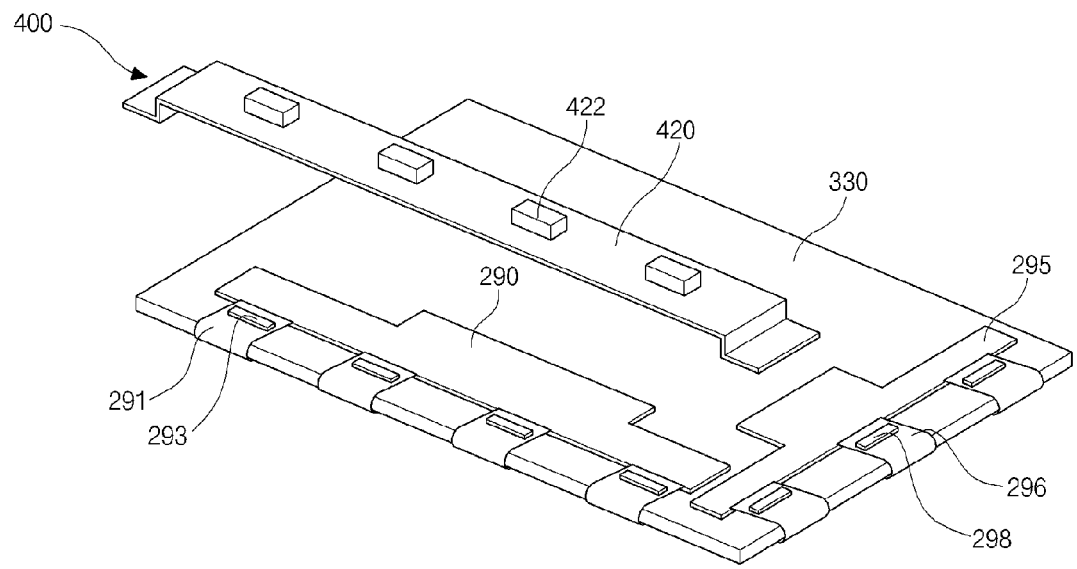
FIG. 2 is a schematic perspective view illustrating a bottom portion of the OELD device according to the first embodiment of the present invention.
Figure 3:
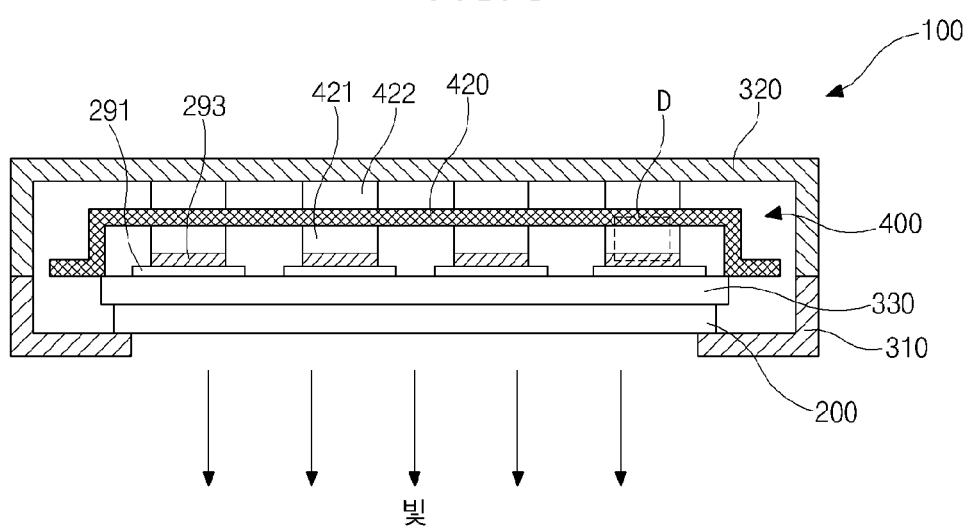
FIG. 3 is a schematic cross-sectional view, taken along a length direction of a thermally conductive unit, of the OELD device according to the first embodiment of the present invention.
Figure 4:
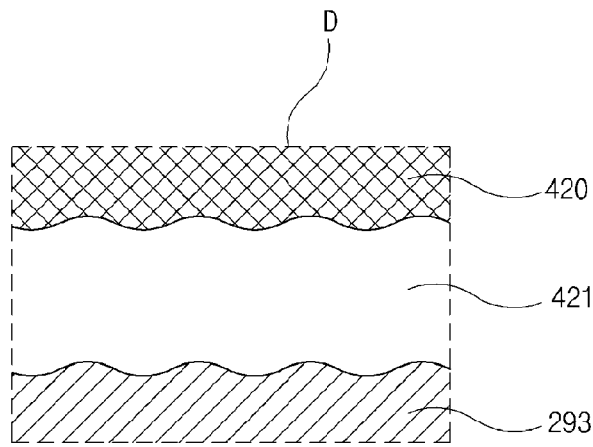
FIG. 4 is an enlarged view of a portion "D" of FIG. 3.
Figure 5:
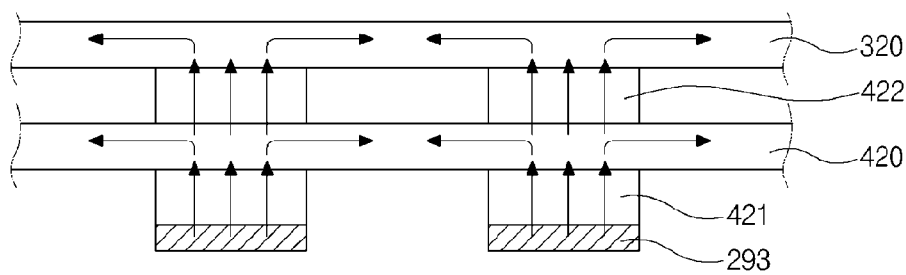
FIG. 5 is a schematic view illustrating a thermal conduction from a source IC to a bottom case through the thermally conductive unit according to the first embodiment of the present invention.

FIG. 1 is a schematic perspective view illustrating an OELD device according to a first embodiment of the present invention, FIG. 2 is a schematic perspective view illustrating a bottom portion of the OELD device according to the first embodiment of the present invention, FIG. 3 is a schematic cross-sectional view, taken along a length direction of a thermally conductive unit, of the OELD device according to the first embodiment of the present invention, FIG. 4 is an enlarged view of a portion "D" of FIG. 3, and FIG. 5 is a schematic view illustrating a thermal conduction from a source IC to a bottom case through the thermally conductive unit according to the first embodiment of the present invention.

Referring to FIGS. 1 to 5, the OELD device 100 according to the first embodiment of the present invention includes an organic electroluminescent panel 200, a driving PCB, a top case 310 and a bottom case 320. The driving PCB may include a source PCB 290 and a gate PCB 295.

The organic electroluminescent panel 200 includes a plurality of pixel regions in matrix form to display images, and an organic light emitting diode is in each pixel region. The organic electroluminescent panel 200 may include a first substrate 210 and a second substrate 250 facing each other.

On an inner surface of the first substrate 210, a plurality of source lines and a plurality of gate lines crossing each other to define the plurality of pixel regions may be formed. In each pixel region, a switching thin film transistor and a driving thin film transistor may be formed.

In a first region of a peripheral region of the inner surface of the first substrate 210, a plurality of source pads extending from the plurality of source lines, respectively, are arranged along a first direction. In a second region of the peripheral region of the inner surface of the first substrate, a plurality of gate pads extending from the plurality of gate lines, respectively, are arranged along a second direction. The first direction may be perpendicular to the second direction, and the first and second regions of the peripheral region may be adjacent to each other.

The source PCB 290 is coupled with the source pads through at least one first flexible film 291. The at least one first flexible film 291 are arranged along the first direction. The gate PCB 295 is coupled with the gate pads through at least one second flexible film 296. The at least one second flexible film 296 are arranged along the second direction.

A TCP film may be used as the first flexible film 291. The first flexible film 291 includes a plurality of conductive patterns. An end portion of the first flexible film 291 is connected to the source pads, and an opposing end portion of the first flexible film 291 is connected to the source PCB 290. A source IC 293 as a driving IC may be installed on an outer surface of the first flexible film 291. The source IC 293 is supplied with source signals from the source PCB 290 and output the source signals. The outputted source signals are supplied to the corresponding source pads, then the corresponding source lines, and then the corresponding pixel regions.

A TCP film may be used as the second flexible film 296. The second flexible film 296 includes a plurality of conductive patterns. An end portion of the second flexible film 296 is connected to the gate pads, and an opposing end portion of the second flexible film 296 is connected to the gate PCB 295. A gate IC 298 as a driving IC may be installed on an outer surface of the second flexible film 296. The gate IC 298 is supplied with gate signals from the gate PCB 295 and output the gate signals. The outputted gate signals are supplied to the corresponding gate pads, and then the corresponding gate lines to switch the switching thin film transistors connected to the gate lines. When the gate IC is installed or formed on the first substrate 210, the second flexible film 296 may not be used.

The first and second flexible films 291 and 296 may be bent in a manufacturing process of the OELD device 100 toward a surface opposing to a viewing surface of the organic electroluminescent panel 200. For example, the opposing surface is an outer surface of the first substrate 210. The viewing surface of the organic electroluminescent panel 200 is a surface through which a viewer views images produced by the organic electroluminescent panel 200. For example, the viewing surface is an outer surface of the second substrate 250.

After the first and second flexible films 291 and 296 are attached to the organic electroluminescent panel 200, the first and second flexible films 291 and 296 are bent along a side and the opposing surface of the organic electroluminescent panel 200. Accordingly, the source PCB 290 and the gate PCB 295 are located on the opposing surface of the organic electroluminescent panel 200. Further, the source IC 293 and the gate IC 298 are located on the opposing surface of the organic electroluminescent panel 200.

At least one thermally conductive plate 330 may be attached on the opposing surface of the organic electroluminescent panel 200. For example, the at least one thermally conductive plate 330 includes first and second thermally conductive plates 330a and 330b. At least one of the first and second thermally conductive plates 330a and 330b may be formed of a TIM (thermal interface material) having a high thermal conductivity.

When the thermally conductive plate 330 is attached on the opposing surface of the organic electroluminescent panel 200, the first and second flexible films 291 and 296 are located on an outer surface of the thermally conductive plate 330.

The bottom case 320 is on the opposing surface of the organic electroluminescent panel 200, for example, the outer surface of the first substrate 210 and protects a bottom of the OELD device 100. The bottom case 320 may be made of a metallic material.

The top case 310 covers a peripheral region of the viewing surface of the organic electroluminescent panel 200, for example, a peripheral region of the outer surface of the second substrate 250. The top case 310 has an open portion through which displayed images are passed through toward the viewer. The top case 310 may be made of a metallic material.

The thermally conductive unit 400 may be located on the source IC 293. The source IC 293 produces much heat in operation. For example, a temperature of the source IC 293 raises up to about 80 or more degrees Celsius (° C.). In order to relieve the heat from the high temperature source IC 293, the thermally conductive unit 400 is employed.

The thermally conductive unit 400 extends, for example, along the first direction in which the source ICs 293 are arranged. The thermally conductive unit 400 may includes at least one first thermally conductive pad 421, a cover plate 420 and at least one second thermally conductive pad 422. The thermally conductive unit 400 functions to transfer the heat from the source ICs 293 to, for example, the bottom case 320.

The at least one first thermally conductive pad 421 is located on an inner surface of the cover plate 420. The at least one first thermally conductive pad 421 is arranged along a length direction of the cover plate 420 i.e., the first direction. The at least one first thermally conductive pad 421 may correspond to the at least one source ICs 293, respectively. The first thermally conductive pad 421 may contact the source IC 293.

The first thermally conductive pad 421 may be made of an elastic material, for example, a TIM material. The TIM material has a high thermal conductivity and may include a silicon group material. When the first thermally conductive pad 421 is elastic, the first thermally conductive pad 421 has substantially a surface contact with the source IC 293 over an entire interface therebetween.

In other words, the source IC 293 has a rough surface to some extent. When the first thermally conductive pad 421 is made of a hard material, the first thermally conductive pad 421 also has a rough surface to some extent. In this case, the source IC 293 has a point contact with the first thermally conductive pad 421 because of the surface roughness of both of them. This causes air pocket to exist between the point contact positions. However, when the first thermally conductive pad 421 is made of the elastic material, a surface of the first thermally conductive pad 421 covers substantially an entire corresponding surface of the source IC 293, as shown in FIG. 4. Accordingly, the air pocket due to the point contact hardly exists at the interface between the first thermally conductive pad 421 and the source IC 293, and the contact area therebetween can be maximized. Accordingly, thermal conductive path is broadened all over the interface, and thermal resistance between the first thermally conductive pad 421 and the source IC 293 is remarkably reduced. Accordingly, the heat produced from the source IC 293 can be effectively thermally conducted toward the first thermally conductive pad 421.

The cover plate 420 may has a rough surface. Since the first thermally conductive pad 421 has elasticity, the cover plate 420 has substantially a surface contact with the first thermally conductive pad 421. Accordingly, the heat from the source IC 293 can be effectively transferred to the cover plate 420.

The cover plate 420 extends along the first direction and may be formed in a single body. The cover plate 420 may be made of a material having a high thermal conductivity, for example, aluminum (Al). Further, the cover plate 420 may be made of high purity aluminum, for example, aluminum with 99.5% purity. The cover plate 420 may be anodized so that a black anodized film is formed at the surface of the cover plate 420. Since the anodized cover plate 420 has the black surface, a thermal absorption of the cover plate 420 increases and the cover plate 420 has a higher thermal conductivity. As a result, the heat transferred to the cover plate 420 can be effectively distributed all over the cover plate 420.

The at least one second thermally conductive pad 422 is located on an outer surface of the cover plate 420. The at least one second thermally conductive pad 422 is arranged along the length direction of the cover plate 420. For example, the at least one second thermally conductive pad 422 may correspond to the at least one first thermally conductive pad 421, respectively.

The second thermally conductive pad 422 may be made of an elastic material, for example, a TIM. Accordingly, the second thermally conductive pad 422 has substantially a surface contact with the cover plate 420. Accordingly, the heat can be effectively transferred to the second thermally conductive pad 422.

As described above, the heat produced from the source IC 293 are effectively discharged through the first thermally conductive pad 421, the cover plate 420 and the second thermally conductive pad 422 of the thermally conductive unit 400.

The heat transferred to the thermally conductive unit 400 is transferred to the bottom case 320. To do this, the second thermally conductive pad 422 contacts the bottom case 320. The bottom case 320 may be made of a metallic material having a high thermal conductivity, for example, aluminum. The bottom case 320 may be anodized to have a black surface film.

The bottom case 320 may have a rough surface. Since the second thermally conductive pad 422 has elasticity, the bottom case 320 has substantially a surface contact with the second thermally conductive pad 422. Accordingly, the heat transferred to the thermally conductive unit 400 can be effectively transferred to the bottom case 320. The heat transferred to the bottom case 320 is distributed all over the large-sized bottom case 320 and discharged into the atmosphere. As a result, the heat produced from the source IC 293 can be effectively discharged outside.

A portion of the bottom case 320 corresponding to the thermally conductive unit 400 may protrude outside to some extent. For example, the portion of the bottom case 320 may protrude by a thickness of the thermally conductive unit 400.

As described above, since the thermally conductive unit 400 is configured to contact the source IC 293 and the bottom case 320, the thermal transfer path from the source IC 293 to the bottom case 320 can be made. Further, since the first and second thermally conductive pads 421 and 422 having elasticity are configured to be located between the source IC 293 and the cover plate 420 and between the cover plate 420 and the bottom case 320, the thermal transfer path is broadened over the interfaces therebetween, and the thermal resistance can be remarkably reduced. Accordingly, the high heat from the source IC 293 can be effectively relieved.

In this embodiment, a number of the at least one first thermally conductive pad 421 and a number of the at least one second thermally conductive pad 422 are not limited. For example, one first thermally conductive pad 421 formed in a single body may be used. In this case, the one first thermally conductive pad 421 may extend along the first direction and contact all of the at least one source ICs 293. Alternatively, two or more first thermally conductive pads 421 may be used. When the two first thermally conductive pads 421 are used, one of them may contact some of the at least one source ICs and the other of them may contact the rest of the at least one source ICs.

In a similar way, the one or more second conductive pads 422 may be configured in the thermally conductive unit 400.

Figure 6:
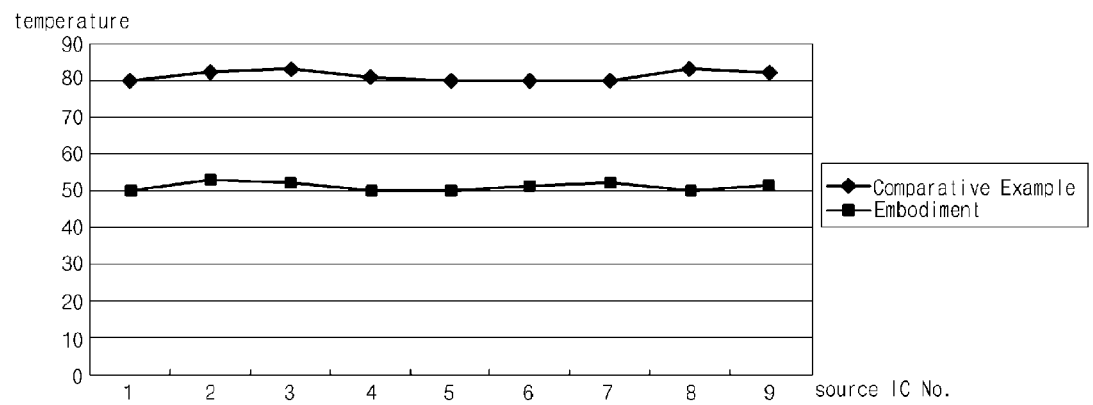
FIG. 6 is a graph illustrating temperatures, obtained in experiment, of nine source ICs Nos. 1 to 9 of a comparative example and of the first embodiment of the present invention.

Table 1 and FIG. 6 show temperatures, obtained in experiment, of nine source ICs Nos. 1 to 9 of a comparative example and of the first embodiment of the present invention. Table 2 shows statistical data based upon Table 1 and FIG. 6. In the comparative example, no thermally conductive means is configured to contact the source ICs.

TABLE 1

| Source IC No. | Comparative Example(° C.) | Embodiment(° C.) |
| --- | --- | --- |
| 1 | 80 | 50 |
| 2 | 82 | 53 |
| 3 | 83 | 52 |
| 4 | 81 | 50 |
| 5 | 80 | 50 |
| 6 | 80 | 51 |
| 7 | 80 | 52 |
| 8 | 83 | 50 |
| 9 | 82 | 51 |

TABLE 2

|  | Comparative Example | Embodiment |
| --- | --- | --- |
| Maximum temperature(° C.) | 83 | 53 |
| Average temperature(° C.) | 81.2 | 51 |
| Minimum temperature(° C.) | 80 | 50 |
| Temperature difference(° C.) | about 30 | |

Referring to Tables 1 and 2 and FIG. 6, in the comparative example, the source ICs have about 80 or more degrees Celsius (° C.).

However, in the embodiment, the thermally conductive unit (400 of FIG. 1) is configured to contact the source IC and the bottom case (320 of FIG. 1). Accordingly, the source ICs have about 50 degrees Celsius (° C.). In other words, the temperature of the source IC of the embodiment is reduced by about 30 degrees Celsius (° C.) compared with the comparative example. When only the thermally conductive pad of the related art is used, the temperature of the source IC is reduced by about 10 to 20 degrees Celsius (° C.) compared with the comparative example.

As a result, the experimental result as above shows that the thermally conductive unit of the embodiment makes a broad thermal transfer path from the source IC to the bottom case and thus remarkably assists the heat from the source IC to be discharged outside.

The thermally conductive unit of the embodiment functions to prevent the first flexible film (291 of FIG. 1) and the source IC from moving off their desired position. In other words, referring to FIGS. 1 to 3, the thermally conductive unit 400 presses the source IC 293 and the first flexible film 291. Accordingly, the source IC 293 and the first flexible film 291 are fixed and hardly moved by the thermally conductive unit 400.

Figure 7:
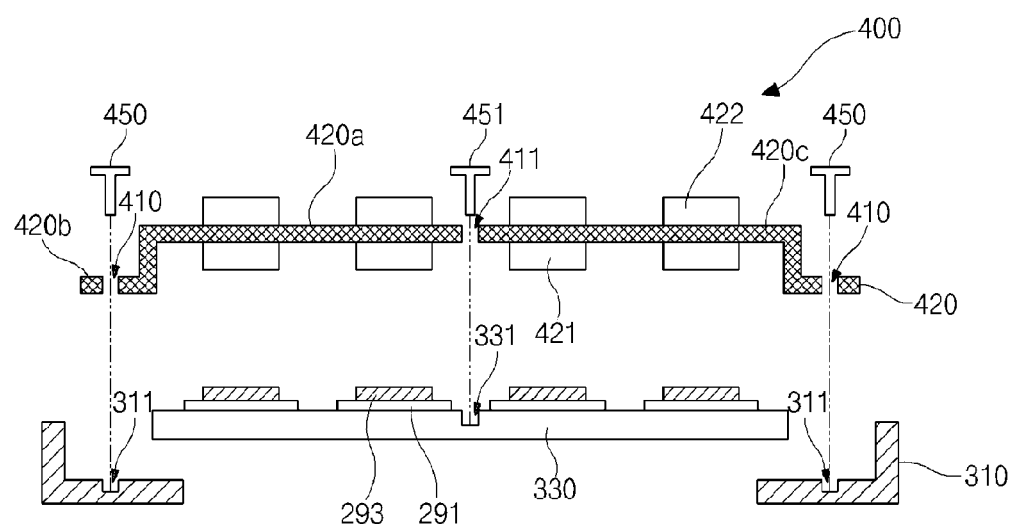
FIG. 7 is a schematic cross-sectional view illustrating coupling the thermally conductive unit in the OELD device according to the first embodiment of the present invention.

FIG. 7 is a schematic cross-sectional view illustrating coupling the thermally conductive unit in the OELD device according to the first embodiment of the present invention.

Referring to FIG. 7, the cover plate 420 of the thermally conductive unit 400 includes a cover portion 420a, a coupling portion 420b and a connecting portion 420c. The cover portion 420a corresponds to and covers the at least one source IC 293. The coupling portion 420b and the connecting portion 420c may be formed by bending each of both end portions of the cover plate 420. For example, the connecting portion 420c is downwardly bent perpendicularly to the cover portion 420a. The coupling portion 420b is outwardly bent perpendicularly to the connecting portion 420c. The coupling portion 420b is parallel to the cover portion 420a.

The coupling portion 420b may have a through hole 410 therein. A coupling means, for example, a screw 450 is inserted into the through hole 420. The screw 450 is further inserted into a component of the OELD device (100 of FIG. 1), for example, a receiving hole 322 of the top case 310. Accordingly, the cover plate 420 is coupled with the top case 310 and fixed. Since the coupled cover plate 420 presses the source IC 293 and the first flexible film 291, the cover plate 420 can prevent the source IC 293 and the first flexible film 291 from moving. Even though the thermally conductive unit 400 presses the source IC 293, since the first thermally conductive pad 421 having elasticity functions as a pressure buffer, the source IC 293 can be prevented from being damaged by the pressure of the thermally conductive unit 400.

The cover portion 420a may have another through hole 411, and the thermally conductive plate 330 may have another receiving hole 331 corresponding to the another through hole 411. A coupling means, for example, a screw 451 passes through the another through hole 411 and the another receiving hole 331. The position of the another through hole 411 and the another receiving hole 331 may be located between adjacent first flexible films 291. Accordingly, the thermally conductive unit 400 is more firmly fixed, and thus the source IC 293 and the first flexible film 291 can be more prevented from moving.

Further, as shown in FIG. 3, since the bottom case 320 presses the thermally conductive unit 400, the source IC 293 and the first flexible film 291 can be much more prevented from moving. Since the first and second thermally conductive pads 421 and 422 function as a pressure buffer, damage to the source IC due to the pressure thereon can be prevented.

It is shown in FIG. 7 that the thermally conductive unit 400 is coupled with the top case 310 and the thermally conductive plate 330. However, it should be understood that the thermally conductive unit 400 may be coupled with any component of the OELD device, for example, at least one of the thermally conductive plate 330, the top case 310 and the bottom case (320 of FIG. 1).

Figure 8:
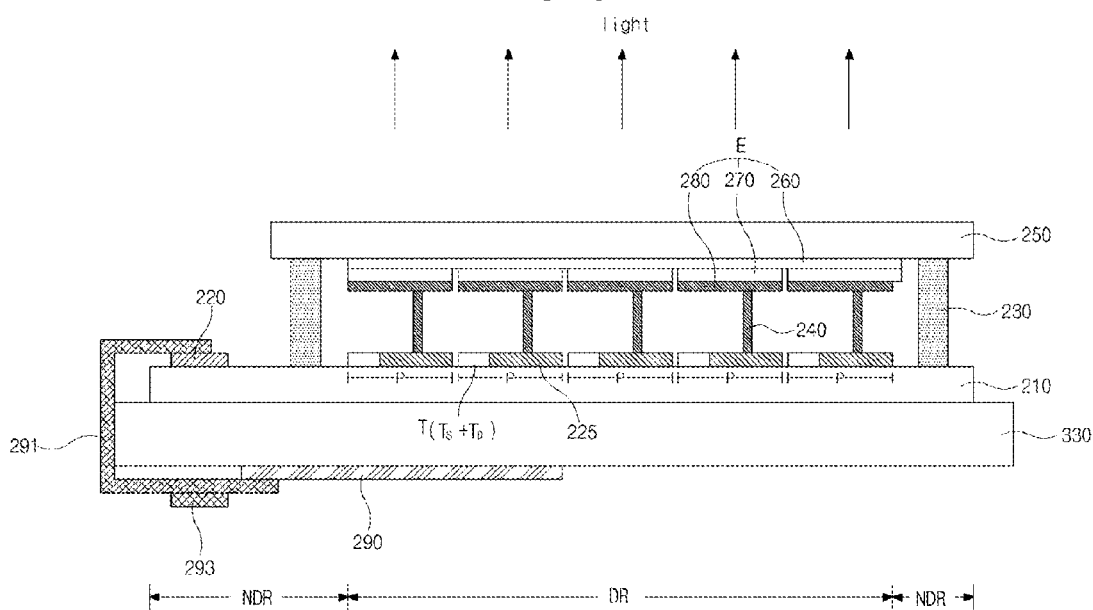
FIG. 8 is a schematic cross-sectional view illustrating an organic electroluminescent panel employed into the OELD device according to the first embodiment of the present invention.

FIG. 8 is a schematic cross-sectional view illustrating an organic electroluminescent panel employed into the OELD device according to the first embodiment of the present invention.

Referring to FIG. 8, the organic electroluminescent panel includes a display region DR for displaying images and a non-display region NDR which is a peripheral region outside the display region DR.

A plurality of gate lines and a plurality of source lines cross each other on an inner surface of a first substrate 210 to define a plurality of pixel regions P in the display region DR. A plurality of source pads 220 are arranged along a first direction in a first region of the peripheral region i.e., the non-display region NDR. The source pad 220 is located at an end of the source line. A plurality of gate pads are arranged along a second direction in a second region of the non-display region NDR. The gate pad is located at an end of the gate line. In the pixel region P, thin film transistors T are formed. The thin film transistors T include a switching thin film transistor $T_S$ connected to the corresponding gate and source lines, and a driving thin film transistor $T_D$ connected to the switching thin film transistor $T_S$. A drain electrode of the driving thin film transistor $T_D$ may be connected to a connection electrode 225. Alternatively, the drain electrode of the driving thin film transistor $T_D$ may extend and function as the connection electrode 225.

A first electrode 260 is formed on an inner surface of the second substrate 250. An organic emitting layer 270 and a second electrode 280 may be sequentially formed on an inner surface of the first electrode 260 in the pixel region P. A separator may be formed on the first electrode 260 between adjacent pixel regions P. When the separator is used, the separator separates the organic emitting layer 270 and the second electrode 280 in each pixel region P without patterning processes of the organic emitting layer 270 and the second electrode 280. The first electrode 260, the organic emitting layer 270 and the second electrode 280 forms an organic light emitting diode E. The first electrode 260 may be formed of a transparent conductive material, for example, indium-tin-oxide (ITO), indium-zinc-oxide (IZO) and indium-tin-zinc-oxide (ITZO). The second electrode 280 may be formed of an opaque conductive material. Accordingly, light emitted from the organic emitting diode 270 travels toward the first electrode 260.

The driving thin film transistor $T_D$ is electrically connected to the organic light emitting diode E through a connection pattern 240. The connection pattern 240 is along a cell gap of the organic electroluminescent panel and connects the organic light emitting diode E and the driving thin film transistor $T_D$. Further, the connection pattern 240 functions to maintain the cell gap. The connection pattern 240 may be formed on one of the first and second substrates 210 and 250.

A seal pattern 230 is formed between the first and second substrates 210 and 250 and along the non-display region NDR. The seal pattern 230 attaches the first and second substrates 210 and 250. The seal pattern 230 may be formed on one of the first and second substrates 210 and 250. After the seal pattern 230 is formed, the first and second substrates 210 and 250 are aligned to face each other and attached.

The organic electroluminescent panel emits light in a direction to the second substrate 250. Accordingly, an outer surface of the second substrate 250 is referred to as a viewing surface of the organic electroluminescent panel. An outer surface of the first substrate 210 is referred to as an opposing surface of the organic electroluminescent panel opposite to the viewing surface. Accordingly, a source PCB 290 is located on the opposing surface of the organic electroluminescent panel. A first flexible film 291 connecting the source PCB 290 and the source pad 220 is bent toward the opposing surface of the organic electroluminescent panel. Accordingly, a source IC 293 on an outer surface of the first flexible film 291 faces the bottom case (320 of FIG. 1).

When a thermally conductive plate 330 is attached on the outer surface of the first substrate 210, the source PCB 290 is located on an outer surface of the thermally conductive plate 330.

Both end portions of an inner surface of the first flexible film 291 are connected to the source PCB 290 and the source pad 220, respectively.

Referring to FIGS. 1 and 8, after bending the first flexible film 291, the thermally conductive unit 400 covers the source IC 293. Then, the organic electroluminescent panel is placed on an inner surface of the bottom case 320, and the bottom case 320 presses and contacts the thermally conductive unit 400. Then, the bottom case 320 is coupled with the top case 310. Alternatively, referring to FIGS. 7 and 8, in case that the thermally conductive unit 400 is coupled with the top case 310, the thermally conductive unit 400 is coupled with the top case 310, then the organic electroluminescent panel is placed on the bottom case 320, and then the bottom case 320 is coupled with the top case 310. It should be understood that assembling the components of the OELD device can be performed in various manners.

In the organic electroluminescent panel of FIG. 8, the thin film transistors and the organic light emitting diode are formed in different substrates. Alternatively, an organic electroluminescent panel, which includes the thin film transistors and the organic light emitting diodes on the same substrate, may be used for the OELD device of the first embodiment.

Figure 9:
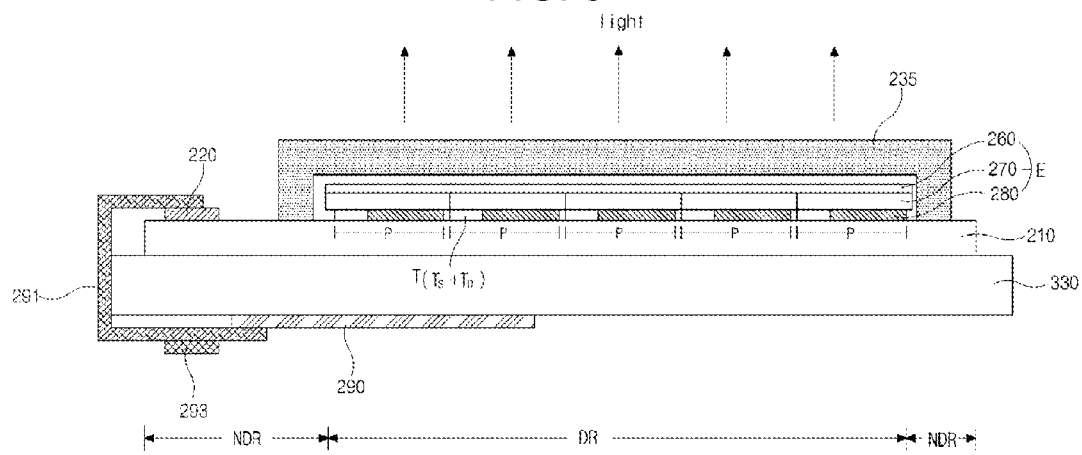
FIG. 9 is a schematic cross-sectional view illustrating another organic electroluminescent panel employed into the OELD device according to the first embodiment of the present invention.

FIG. 9 is a schematic cross-sectional view illustrating another organic electroluminescent panel employed into the OELD device according to the first embodiment of the present invention.

Referring to FIG. 9, in the organic electroluminescent panel, thin film transistors T and an organic light emitting diode E are formed on the same substrate 210.

A second electrode 280, an organic emitting layer 270 and a first electrode 260 of the organic light emitting diode E may be sequentially located on an inner surface of the substrate 210. The second electrode 280 is connected to a driving thin film transistor $T_D$. The second electrode 280 may be formed of an opaque conductive material. The first electrode 260 may be made of a transparent conductive material. Accordingly, light emitted from the organic emitting layer 270 travels toward the first electrode 260.

A transparent protector 235 may be configured to cover at least a display region DR of the substrate 210 having the organic light emitting diode E.

In the organic electroluminescent panel described above, light is emitted from the substrate 210 to the transparent protector 235. Accordingly, an outer surface of the transparent protector 235 is referred to as a viewing surface of the organic electroluminescent panel, and a source PCB 290 is located on an opposing surface of the organic electroluminescent panel i.e., an outer surface of the substrate 210. The first flexible film 291 is bent toward the outer surface of the substrate 210. Accordingly, a source IC 293 on an outer surface of the first flexible film 291 faces the bottom case (320 of FIG. 1).

Alternatively, instead of the protector 235 of FIG. 9, a transparent opposing substrate may be used. The opposing substrate may be attached to the substrate 210 using the seal pattern (230 of FIG. 8).

In the first embodiment as above, the driving PCB and the driving IC is located on the substrate including the thin film transistors out of the substrates of the organic electroluminescent panel. Alternatively, on the substrate opposing to the substrate including the thin film transistors, the driving PCB and the driving IC may be located.

Figure 10:
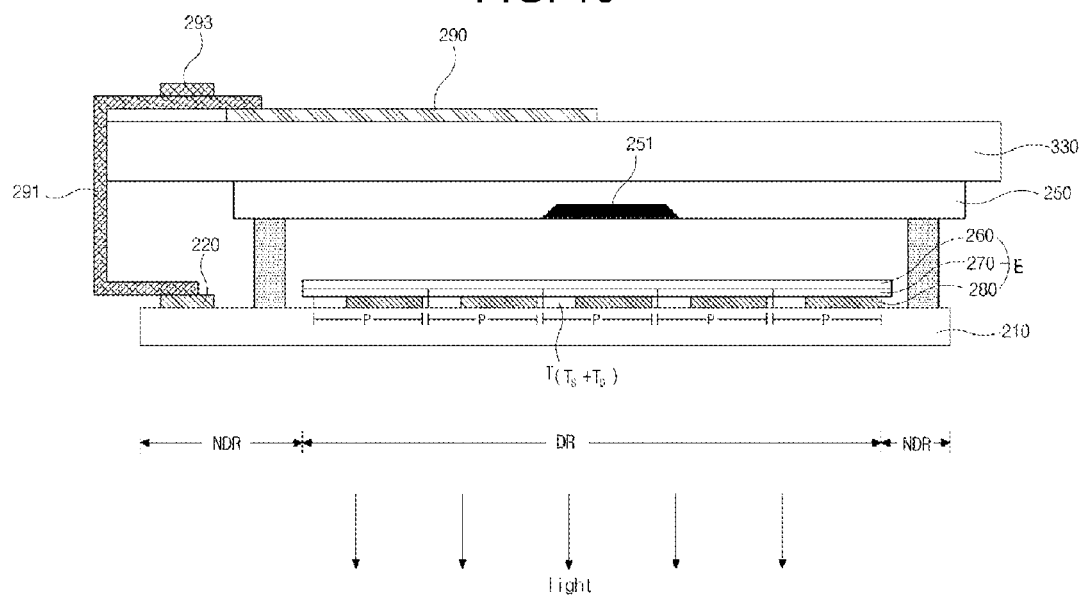
FIG. 10 is a schematic cross-sectional view illustrating an organic electroluminescent panel in an OELD device according to a second embodiment of the present invention.

FIG. 10 is a schematic cross-sectional view illustrating an organic electroluminescent panel in an OELD device according to a second embodiment of the present invention. Explanations of parts similar to parts of the first embodiment may be omitted.

Referring to FIG. 10, in the organic electroluminescent panel of the second embodiment, an organic light emitting diode E and transistors T may be formed on the same substrate, for example, a first substrate 210.

A second electrode 280, an organic emitting layer 270 and a first electrode 260 of the organic light emitting diode E may be sequentially located on an inner surface of the first substrate 210. The second electrode 280 is connected to a driving thin film transistors $T_D$. The second electrode 280 may be made of a transparent conductive material while the first electrode 260 may be made of an opaque conductive material. Accordingly, light emitted from the organic emitting layer 270 travels toward the first substrate 210.

A desiccant 251 may be attached into a second substrate 250. The desiccant 251 functions to remove moisture, oxygen and the like in the organic electroluminescent panel.

The organic electroluminescent panel may display images by emitting light in a direction to the first substrate 210. Accordingly, an outer surface of the first substrate 210 is referred to as a viewing surface of the organic electroluminescent panel. Accordingly, a driving PCB, for example, a source PCB 290 is located on an opposing surface of the organic electroluminescent panel 200, for example, an outer surface of the second substrate 250. A first flexible film 293 connecting a source pad 220 and the source PCB 290 is bent toward the outer surface of the second substrate 250. Accordingly, a source IC 293 on an outer surface of the first flexible film 291 faces a bottom case (320 of FIG. 1).

An outer surface of one of both end portions of the first flexible film 291 is connected to the source pad 220. An inner surface of the other of the both end portions of the first flexible film 291 is connected to the source PCB 290.

A thermally conductive plate 330 may be attached on the outer surface of the second substrate 250. When the thermally conductive plate 330 is used, the source PCB 290 is located on an outer surface of the thermally conductive plate 330.

After the first flexible film 291 is bent, a thermally conductive unit (400 of FIG. 1) may cover the source IC 293. Then, assembling processes similar to the assembling processes of the first embodiment may be performed.

As described in the embodiments of the present invention, the thermally conductive unit is configured between the source IC and the bottom case, and the thermal transfer path from the source IC to the bottom case is made. Further, since the elastic thermally conductive pads are configured between the source IC and the cover plate and between the cover plate and the bottom case, the thermal transfer path is broadened all over the interface and the thermal resistance is reduced. Accordingly, the thermal conduction can be maximized, and the heat of the source IC can be effectively discharged outside.

In addition, the thermally conductive unit may be coupled with at least one component of the OELD device, and the bottom case presses the thermally conductive unit. Accordingly, the source IC and the flexible film can be firmly fixed and prevented from moving.

In addition, the thermally conducive unit has a simple structure. Accordingly, installation can be simplified. Further, a portion of the OELD device, where the thermally conductive unit is installed, increases a little in thickness, the OELD device, however, can be kept slim overall.

In the embodiments, examples of the organic electroluminescent panels employed into the OELD device are described. However, it should be understood that organic electroluminescent panels having other structures can be employed into the OELD device.

Further, the thermally conductive unit can be used for various types of driving ICs of the OELD device. For example, for the gate IC, or a driving IC installed on the source PCB, gate PCB or other PCB, the thermally conductive unit can be used.

Further, the thermally conductive unit can be used for driving ICs installed into other devices, for example, a flat display panel, electronic device and the like. In this case, to discharge heat of the driving IC, the thermally conductive unit may be configured between the driving IC and a case which is located near the driving IC and made of a metallic material.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    an organic electroluminescent panel that includes a viewing surface for displaying images and an opposing surface and includes a plurality of source pads in a peripheral region of the organic electroluminescent panel;
    a bottom case configured to face the opposing surface of the organic electroluminescent panel;
    at least one source IC configured to output a source signal corresponding the source pad, and be between the bottom case and the opposing surface of the organic electroluminescent panel; and
    a thermally conductive unit configured to be between the at least one source IC and the bottom case and contact the at least one source IC and the bottom case,
    wherein the thermally conductive unit is coupled with a top case that covers a peripheral region of the viewing surface,
    wherein the thermally conductive unit includes a cover plate including a cover portion, a coupling portion and a connecting portion,
    wherein the cover portion corresponds to the at least one source IC, the connecting portion is downwardly bent perpendicularly to the cover portion, and the coupling portion is outwardly bent perpendicularly to the connecting portion, is parallel to the cover portion and is coupled with the top case.

2. The device according to claim 1, further comprising a flexible film, wherein one of the at least one source IC is on an outer surface of the flexible film, wherein both end portions of the flexible film are coupled with the source pad and a source PCB, respectively, wherein the source PCB is between the bottom case and the opposing surface of the organic electroluminescent panel.

3. The device according to claim 1, wherein the thermally conductive unit includes:
    the cover plate made of a metallic material;
    at least one first thermally conductive pad configured to contact the at least one source IC and an inner surface of the cover plate; and
    at least one second thermally conductive pad configured to contact the bottom case and an outer surface of the cover plate.

4. The device according to claim 3, wherein the at least one first thermally conductive pad corresponds to the at least one source IC, respectively, and wherein the at least one second thermally conductive pad corresponds to the at least one first thermally conductive pad, respectively.

5. The device according to claim 3, wherein one of the at least one first thermally conductive pad and the at least one second thermally conductive pad is made of an elastic TIM (thermal interface material).

6. The device according to claim 3, wherein each of the bottom case and the cover plate is made of aluminum (Al).

7. The device according to claim 6, wherein the cover plate is made of aluminum (Al) with 99.5% purity, and wherein the cover plate includes an aluminum anodized film at a surface of the cover plate.

8. The device according to claim 1, wherein the organic electroluminescent panel includes first and second substrates facing each other, wherein a switching thin film transistor and a driving thin film transistor are on an inner surface of the first substrate, wherein an organic light emitting diode are on an inner surface of the second substrate, wherein light is emitted in a direction to the second substrate, and wherein the plurality of source pads are on the inner surface of the first substrate.

9. The device according to claim 1, wherein the organic electroluminescent panel includes first and second substrates facing each other, wherein a switching thin film transistor, a driving thin film transistor and an organic light emitting diode are on an inner surface of the first substrate, wherein light is emitted in a direction to the first substrate, and wherein the plurality of source pads are on the inner surface of the first substrate.

10. A method of manufacturing an organic electroluminescent display device, comprising:
forming an organic electroluminescent panel that includes a viewing surface for displaying images and an opposing surface and includes a plurality of source pads in a peripheral region of the organic electroluminescent panel;
configuring at least one source IC to be on the opposing surface of the organic electroluminescent panel, wherein the at least one source IC outputs a source signal corresponding to the source pad;
configuring a thermally conductive unit to contact the at least one source IC at an inner surface of the thermally conductive unit; and
configuring a bottom case to contact an outer surface of the thermally conductive unit,
wherein the thermally conductive unit is coupled with a top case that covers a peripheral region of the viewing surface,
wherein the thermally conductive unit includes a cover plate including a cover portion, a coupling portion and a connecting portion,
wherein the cover portion corresponds to the at least one source IC, the connecting portion is downwardly bent perpendicularly to the cover portion, and the coupling portion is outwardly bent perpendicularly to the connecting portion, is parallel to the cover portion and is coupled with the top case.

11. The method according to claim 10, wherein configuring the at least one source IC to be on the opposing surface of the organic electroluminescent panel includes bending a flexible film, an end portion of which is connected to the source pad and an outer surface of which one of the at least one source IC is on, such that the one of the at least one source IC is on the opposing surface of the organic electroluminescent panel, and wherein an opposing end portion of the flexible film is connected to a source PCB which is between the bottom case and the opposing surface of the organic electroluminescent panel.

12. The method according to claim 10, wherein the thermally conductive unit includes:
the cover plate made of a metallic material;
at least one first thermally conductive pad configured to contact the source IC and an inner surface of the cover plate; and
at least one second thermally conductive pad configured to contact the bottom case and an outer surface of the cover plate.

13. The method according to claim 12, wherein the at least one first thermally conductive pad corresponds to the at least one source IC, respectively, and wherein the at least one second thermally conductive pad corresponds to the at least one first thermally conductive pad, respectively.

14. The method according to claim 12, wherein one of the at least one first thermally conductive pad and the at least one second thermally conductive pad is made of an elastic TIM.

15. The method according to claim 12, wherein each of the bottom case and the cover plate is made of aluminum (Al).

16. The method according to claim 15, wherein the cover plate is made of aluminum (Al) with 99.5% purity and is anodized.

17. An organic electroluminescent display device, comprising:
an organic electroluminescent panel that includes a viewing surface for displaying images and an opposing surface;
a bottom case configured to face the opposing surface of the organic electroluminescent panel;
a driving IC configured to be between the bottom case and the opposing surface of the organic electroluminescent panel; and
a thermally conductive unit configured to be between the driving IC and the bottom case and contact the driving IC and the bottom case,
wherein the thermally conductive unit includes:
a cover plate made of a metallic material;
a first elastic thermally conductive pad configured to contact the driving IC and an inner surface of the cover plate; and
a second elastic thermally conductive pad configured to contact the bottom case and an outer surface of the cover plate,
wherein the thermally conductive unit is coupled with a top case that covers a peripheral region of the viewing surface,
wherein the thermally conductive unit includes a cover plate including a cover portion, a coupling portion and a connecting portion,
wherein the cover portion corresponds to the at least one source IC, the connecting portion is downwardly bent perpendicularly to the cover portion, and the coupling portion is outwardly bent perpendicularly to the connecting portion, is parallel to the cover portion and is coupled with the top case.

* * * * *